(12) United States Patent
Mäntymäki et al.

(10) Patent No.: US 9,394,609 B2
(45) Date of Patent: Jul. 19, 2016

(54) ATOMIC LAYER DEPOSITION OF ALUMINUM FLUORIDE THIN FILMS

(71) Applicant: ASM IP HOLDING B.V., Almere (NL)

(72) Inventors: Miia Mäntymäki, Helsinki (FI); Mikko Ritala, Espoo (FI); Markku Leskelä, Espoo (FI)

(73) Assignee: ASM IP HOLDING B.V., Almere (NL)

(*) Notice: Subject to any disclaimer, the term of this patent is extended or adjusted under 35 U.S.C. 154(b) by 0 days.

(21) Appl. No.: 14/621,218

(22) Filed: Feb. 12, 2015

(65) Prior Publication Data

US 2015/0225853 A1 Aug. 13, 2015

Related U.S. Application Data

(60) Provisional application No. 61/939,479, filed on Feb. 13, 2014.

(51) Int. Cl.
| | |
|---|---|
| *C23C 16/22* | (2006.01) |
| *C23C 16/30* | (2006.01) |
| *C23C 16/455* | (2006.01) |

(52) U.S. Cl.
CPC ............ *C23C 16/45553* (2013.01); *C23C 16/30* (2013.01); *C23C 16/45527* (2013.01)

(58) Field of Classification Search
CPC .......... C23C 16/22; C23C 16/30; C23C 16/08
See application file for complete search history.

(56) References Cited

U.S. PATENT DOCUMENTS

| | | |
|---|---|---|
| 3,708,728 A | 1/1973 | Sterling et al. |
| 3,925,337 A | 12/1975 | Heiberger |
| 4,058,430 A | 11/1977 | Suntola et al. |
| 4,282,267 A | 8/1981 | Küyel |
| 4,389,973 A | 6/1983 | Suntola et al. |
| 4,565,747 A | 1/1986 | Nakae et al. |
| 4,747,367 A | 5/1988 | Posa |
| 4,761,269 A | 8/1988 | Conger et al. |
| 4,767,494 A | 8/1988 | Kobayashi |
| 4,851,095 A | 7/1989 | Scobey et al. |
| 4,935,661 A | 6/1990 | Heinecke et al. |
| 5,071,670 A | 12/1991 | Kelly |
| 5,166,092 A | 11/1992 | Mochizuki et al. |
| 5,221,556 A | 6/1993 | Hawkins et al. |
| 5,270,247 A | 12/1993 | Sakuma et al. |
| 5,281,274 A | 1/1994 | Yoder |
| 5,306,666 A | 4/1994 | Izumi |
| 5,316,793 A | 5/1994 | Wallace et al. |
| 5,342,652 A | 8/1994 | Foster et al. |
| 5,482,262 A | 1/1996 | Hayakawa et al. |
| 5,595,784 A | 1/1997 | Kaim et al. |
| 5,603,771 A | 2/1997 | Seiberras et al. |
| 5,618,395 A | 4/1997 | Gartner |
| 5,691,235 A | 11/1997 | Meikle et al. |
| 5,693,139 A | 12/1997 | Nishizawa et al. |
| 5,711,811 A | 1/1998 | Suntola et al. |
| 5,723,384 A | 3/1998 | Park et al. |
| 5,744,254 A | 4/1998 | Kampe et al. |
| 5,769,950 A | 6/1998 | Takasu et al. |
| 5,789,024 A | 8/1998 | Levy et al. |
| 5,855,680 A | 1/1999 | Soininen |
| 5,916,365 A | 6/1999 | Sherman |
| 5,946,598 A | 8/1999 | Yeh |
| 5,947,710 A | 9/1999 | Cooper et al. |
| 5,964,943 A | 10/1999 | Stein et al. |
| 5,965,004 A | 10/1999 | Cowley et al. |
| 5,972,430 A | 10/1999 | DiMeo et al. |
| 5,973,400 A | 10/1999 | Murakami et al. |
| 6,006,763 A | 12/1999 | Mori et al. |
| 6,015,590 A | 1/2000 | Suntola et al. |
| 6,087,257 A | 7/2000 | Park et al. |
| 6,099,904 A | 8/2000 | Mak et al. |
| 6,104,074 A | 8/2000 | Chen |
| 6,113,977 A | 9/2000 | Soininen et al. |
| 6,124,158 A | 9/2000 | Dautartas et al. |
| 6,139,624 A | 10/2000 | Rupp |
| 6,139,700 A | 10/2000 | Kang et al. |
| 6,144,060 A | 11/2000 | Park et al. |
| 6,156,382 A | 12/2000 | Rajagopalan et al. |
| 6,162,501 A | 12/2000 | Kim |

(Continued)

FOREIGN PATENT DOCUMENTS

| | | |
|---|---|---|
| EP | 0387403 | 9/1990 |
| EP | 0394054 | 10/1990 |

(Continued)

OTHER PUBLICATIONS

Pilvi, Tero, et al., "Atomic layer deposition process with TiF4 as a precursor for depositing metal fluoride thin films". Applied Optics, vol. 47, No. 13, May 1, 2008, pp. C271-C274.*

Mantymaki, Miia, et al., "Atomic Layer Deposition of AlF3 Thin Films Using Halide Precursors". Chemistry of Materials, 2015, 27, 604-611.*

Lee, Younghee, et al., "Atomic Layer Depositionof AlF3 Using Trimethylaluminum and Hydrogen Fluoride". The Journal of Physical Chemistry C, 2015, 119, 14185-14194.*

1988RD-0296076 (Nov. 20, 1998), Field effect transistor structure with improved transconductant—contg. spacer-less conducting gate oxide, and tungsten deposited on source and drain, East Version 2.0.1.4 Patent-Assignee: Anonymous{ANON}, Sep. 19, 2005.

Aarik et al., "Influence of substrate temperature on atomic layer growth and properties of HfO2 thin films", Thin Solid Films, vol. 340, 1999, pp. 110-116.

(Continued)

*Primary Examiner* — Bret Chen

(74) *Attorney, Agent, or Firm* — Knobbe, Martens, Olson & Bear LLP

(57) ABSTRACT

Methods are provided for depositing thin films by vapor deposition using two different metal halide reactants. In some embodiments aluminum fluoride thin films are deposited by atomic layer deposition methods in which a substrate is alternately and sequentially contacted with a first metal halide reactant comprising aluminum, such as $AlCl_3$, and a second metal halide reactant comprising fluorine, such as $TiF_4$.

20 Claims, 13 Drawing Sheets

(56) References Cited

U.S. PATENT DOCUMENTS

| | | |
|---|---|---|
| 6,174,809 B1 | 1/2001 | Kang et al. |
| 6,188,134 B1 | 2/2001 | Stumborg et al. |
| 6,194,310 B1 | 2/2001 | Hsu et al. |
| 6,200,389 B1 | 3/2001 | Miller et al. |
| 6,203,613 B1 | 3/2001 | Gates et al. |
| 6,206,967 B1 | 3/2001 | Mak et al. |
| 6,234,646 B1 | 5/2001 | Ito |
| 6,270,572 B1 | 8/2001 | Kim et al. |
| 6,284,646 B1 | 9/2001 | Leem |
| 6,287,965 B1 | 9/2001 | Kang et al. |
| 6,342,277 B1 | 1/2002 | Sherman |
| 6,355,561 B1 | 3/2002 | Sandhu et al. |
| 6,380,627 B1 | 4/2002 | Weihs et al. |
| 6,391,785 B1 | 5/2002 | Satta et al. |
| 6,416,577 B1 | 7/2002 | Suntola et al. |
| 6,464,779 B1 | 10/2002 | Powell et al. |
| 6,475,276 B1 | 11/2002 | Elers et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,576,053 B1 | 6/2003 | Kim et al. |
| 6,599,572 B2 | 7/2003 | Saanila et al. |
| 6,613,383 B1 | 9/2003 | George et al. |
| 6,616,982 B2 | 9/2003 | Merrill et al. |
| 6,632,595 B2 | 10/2003 | Kikuchi et al. |
| 6,652,924 B2 | 11/2003 | Sherman |
| 6,706,115 B2 | 3/2004 | Leskela et al. |
| 6,727,169 B1 | 4/2004 | Raaijmakers et al. |
| 6,780,704 B1 | 8/2004 | Raaijmakers et al. |
| 6,794,287 B2 | 9/2004 | Saanila et al. |
| 6,797,340 B2 | 9/2004 | Fang et al. |
| 6,800,383 B1 | 10/2004 | Lakhotkin |
| 6,800,552 B2 | 10/2004 | Elers et al. |
| 6,809,026 B2 | 10/2004 | Yoon et al. |
| 6,821,889 B2 | 11/2004 | Elers et al. |
| 6,827,978 B2 | 12/2004 | Yoon et al. |
| 6,833,161 B2 | 12/2004 | Wang et al. |
| 6,863,727 B1 | 3/2005 | Elers et al. |
| 6,902,763 B1 | 6/2005 | Elers et al. |
| 6,986,914 B2 | 1/2006 | Elers et al. |
| 7,015,153 B1 | 3/2006 | Triyoso et al. |
| 7,045,406 B2 | 5/2006 | Huotari et al. |
| 7,138,336 B2 | 11/2006 | Lee et al. |
| 7,211,144 B2 | 5/2007 | Lu et al. |
| 7,211,508 B2 | 5/2007 | Chung et al. |
| 7,268,078 B2 | 9/2007 | Iyer |
| 7,279,432 B2 | 10/2007 | Xi et al. |
| 7,405,158 B2 | 7/2008 | Lai et al. |
| 7,416,981 B2 | 8/2008 | Lee et al. |
| 7,445,976 B2 | 11/2008 | Schaeffer et al. |
| 7,794,798 B2 | 9/2010 | Hautala |
| 7,851,307 B2 | 12/2010 | Ramaswamy et al. |
| 2001/0024387 A1 | 9/2001 | Raaijmakers et al. |
| 2001/0034097 A1 | 10/2001 | Lim et al. |
| 2001/0041250 A1 | 11/2001 | Werkhoven et al. |
| 2002/0004293 A1 | 1/2002 | Soininen et al. |
| 2002/0104481 A1 | 8/2002 | Chiang et al. |
| 2002/0182320 A1 | 12/2002 | Leskela et al. |
| 2003/0026989 A1 | 2/2003 | George et al. |
| 2003/0031793 A1 | 2/2003 | Chang et al. |
| 2003/0049931 A1 | 3/2003 | Byun et al. |
| 2003/0054628 A1 | 3/2003 | Leng et al. |
| 2003/0072975 A1 | 4/2003 | Shero et al. |
| 2003/0082296 A1 | 5/2003 | Elers et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0153181 A1 | 8/2003 | Yoon et al. |
| 2003/0157760 A1 | 8/2003 | Xi et al. |
| 2003/0161952 A1 | 8/2003 | Wang et al. |
| 2003/0181035 A1 | 9/2003 | Yoon et al. |
| 2003/0194825 A1 | 10/2003 | Law et al. |
| 2003/0203616 A1 | 10/2003 | Chung et al. |
| 2004/0130029 A1 | 7/2004 | Raaijmakers et al. |
| 2004/0185183 A1 | 9/2004 | Srinivasan et al. |
| 2004/0206008 A1 | 10/2004 | Sung |
| 2004/0208994 A1 | 10/2004 | Harkonen et al. |
| 2004/0224504 A1 | 11/2004 | Gadgil |
| 2004/0231799 A1 | 11/2004 | Lee et al. |
| 2004/0238876 A1 | 12/2004 | Youn et al. |
| 2005/0037557 A1 | 2/2005 | Doczy et al. |
| 2005/0106877 A1 | 5/2005 | Elers et al. |
| 2005/0215008 A1 | 9/2005 | Orlowski et al. |
| 2005/0271813 A1 | 12/2005 | Kher et al. |
| 2006/0019494 A1 | 1/2006 | Cao et al. |
| 2006/0079090 A1 | 4/2006 | Elers et al. |
| 2006/0165892 A1 | 7/2006 | Weidman |
| 2006/0211224 A1 | 9/2006 | Matsuda et al. |
| 2006/0223300 A1 | 10/2006 | Simka et al. |
| 2006/0240187 A1 | 10/2006 | Weidman |
| 2007/0026671 A1 | 2/2007 | Kim et al. |
| 2007/0054046 A1 | 3/2007 | Ishizaka et al. |
| 2007/0148350 A1 | 6/2007 | Rahtu et al. |
| 2007/0218670 A1 | 9/2007 | Ishizaka |
| 2008/0102204 A1 | 5/2008 | Elers |
| 2008/0113110 A1 | 5/2008 | Elers et al. |
| 2008/0182411 A1 | 7/2008 | Elers |
| 2008/0274617 A1 | 11/2008 | Milligan |
| 2009/0081868 A1 | 3/2009 | Shah et al. |
| 2009/0152620 A1 | 6/2009 | Ahn et al. |
| 2009/0211526 A1 | 8/2009 | Tanaka et al. |
| 2009/0315093 A1 | 12/2009 | Li et al. |
| 2012/0276305 A1* | 11/2012 | Hamalainen ............ C23C 16/08 427/569 |
| 2012/0308739 A1* | 12/2012 | Lansalot-Matras ...... C23C 16/30 427/569 |
| 2013/0078454 A1 | 3/2013 | Thompson et al. |
| 2014/0106070 A1* | 4/2014 | Mantymaki ............ C23C 16/08 427/255.39 |
| 2014/0113197 A1* | 4/2014 | Xiao ..................... H01M 4/131 429/223 |
| 2015/0180023 A1* | 6/2015 | Xiao ..................... H01M 4/366 429/231 |
| 2015/0303101 A1* | 10/2015 | Blomberg ............... H01L 23/48 257/741 |

FOREIGN PATENT DOCUMENTS

| | | |
|---|---|---|
| EP | 0442490 | 8/1991 |
| EP | 0526779 | 2/1993 |
| EP | 0528779 | 2/1993 |
| EP | 0573033 | 12/1993 |
| EP | 0774533 | 5/1997 |
| EP | 0899779 | 3/1999 |
| EP | 1 158 070 | 11/2001 |
| EP | 1167567 | 1/2002 |
| JP | 58033841 | 2/1983 |
| JP | 6037041 | 2/1994 |
| JP | 6069157 | 3/1994 |
| JP | 7230957 | 8/1995 |
| JP | 8264530 | 10/1996 |
| JP | 09-087857 | 3/1997 |
| KR | 2003-0016346 | 2/2003 |
| KR | 2003-0057938 | 7/2003 |
| KR | 2003-0093575 | 12/2003 |
| KR | 2004-0060402 | 7/2004 |
| KR | 2004-0079173 | 9/2004 |
| KR | 2004-0079175 | 9/2004 |
| KR | 2004-0100767 | 12/2004 |
| KR | 2005-0000168 | 1/2005 |
| WO | WO 96/17107 | 6/1996 |
| WO | WO 96/18756 | 6/1996 |
| WO | WO 98/51838 | 11/1998 |
| WO | WO 99/37655 | 7/1999 |
| WO | WO 00/01006 | 1/2000 |
| WO | WO 00/04704 | 1/2000 |
| WO | WO 00/40772 | 7/2000 |
| WO | WO 00/47404 | 8/2000 |
| WO | WO 00/47796 | 8/2000 |
| WO | WO 00/54320 | 9/2000 |
| WO | WO 00/55895 | 9/2000 |
| WO | WO 00/63957 | 10/2000 |

(56) References Cited

FOREIGN PATENT DOCUMENTS

| WO | WO 01/27347 | 4/2001 |
|---|---|---|
| WO | WO 01/29280 | 4/2001 |
| WO | WO 01/29891 | 4/2001 |
| WO | WO 01/29893 | 4/2001 |
| WO | WO 01/53565 | 7/2001 |
| WO | WO 01/66832 | 9/2001 |
| WO | WO 01/78213 | 10/2001 |
| WO | WO 01/88972 | 11/2001 |
| WO | WO 2004/077515 | 9/2004 |
| WO | WO 2006/080782 | 8/2006 |
| WO | WO 2007/041089 | 4/2007 |
| WO | WO 2008/137399 | 11/2008 |

OTHER PUBLICATIONS

Alen et al., "Atomic Layer Deposition of Ta(Al)N(C) Thin Films Using Trimethylaluminum as a Reducing Agent", Journal of the Electrochemical Society, vol. 148, No. 10, pp. G566-G571, 2001.

Andricacos et al., Damascene copper electroplating for chip, IBM Jour. Research and Dev., 1998, vol. 42, Issue 5, pp. 567-574.

Bain et al., Deposition of tungsten by plasma enhanced chemical vapour deposition, J. Phys. IV France, 1999, vol. 9, pp. 827-833.

Chang et al, "Chemical Vapor Deposition of Tantalum Carbide and Carbonitride Thin Films from Me3CE=Ta(CH2CMe3)3 (E=CH, N)," J. Mater. Chem. 13:365-369 (2003).

Chookarjorn et al, "Design of Stable Nanocrystalline Alloys," Science Magazine, vol. 337, pp. 951-954, Aug. 24, 2012.

Elers et al., NbC15 as a precursor in atomic layer epitaxy, Applied Surface Science, Jul. 9, 1994, vol. 82/83, pp. 468-474.

Favis et al., Atomic layer epitaxy of silicon, silicon/germanium and silicon carbide via extraction/exchange processes, Avail. NTIS. Report, 1991, pp. 33.

Fuyuki et al., Atomic layer epitaxy controlled by surface superstructures in silicon carbide, Thin Solid Films, 1993, vol. 225, Issue 1-2, pp. 225-229.

Fuyuki et al., Atomic layer epitaxy of cubic silicon carbide by gas source MBE using surface superstructure, J. Cryst. Growth, 1989, vol. 95, Issue 1-4, pp. 461-463.

Girolami et al., Tailored Organometallics as Low-Temperature CVD Precursors to Thin Films, Materials Research Society Symposium Proceedings, 1988, vol. 121, pp. 429-438.

Gordon et al., "A Kinetic Model for Step Coverage by Atomic Layer Deposition in Narrow Holes or Trenches", Chemical Vapor Deposition, 2003, vol. 9, No. 2, pp. 73-78.

Hara et al., Atomic layer control of .beta.silicon carbide (001) surface, Springer Proc. Phys., 1992, pp. 90-95.

Hiltunen et al., Nitrides of titanium, niobium, tantalum and molybdenum grown as thin films by the atomic layer epitaxy method, Thin Solid Films, 1988, vol. 166, pp. 149-154.

Hultman et al., "Review of the Thermal and Mechanical Stability of TiN-based Thin Films" Zeitscrift Fur Metallkunde 90 (10): 803-813 (1999).

Ihanus et al., "ALE growth of ZnS1-xSex thin films by substituting surface sulfur with elemental selenium," Appl. Surface Sci., 112:154-158 (1997).

International Search Report and Written Opinion dated Apr. 7, 2008, Application No. PCT/US2007/082131.

Jehn et al., Gmelin Handbook of Inorganic and Organometallic Chemistry, 8th Edition, 1993, vol. A 5b, Issue 54, pp. 131-154.

Jeon et al., A Study on the Characteristics of TiN Thin Film Deposited by Atomic Layer Chemical Vapor Deposition Method, J. Vac .Sci. Technol. A, 2000, vol. 18, Issue 4, pp. 1595-1598.

Juppo et al., Deposition of copper films by an alternate supply of CuCl and Zn, J. Vac. Sci. Technol A, Jul./Aug. 1997, vol. 15, Issue 4, pp. 2330-2333.

Kattelus et al., "Electrical Properties of Tantalum Based Composite Oxide Films," Mat. Res. Soc. Symp. Proc. vol. 284, pp. 511-516 (1993).

Kattelus et al., "Layered tantalum-aluminum oxide films deposited by atomic layer epitaxy," Thin Solid Films, Vo. 225, pp. 296-298 (1993).

Kim et al., "Novel capacitor technology for high density stand-alone and embedded DRAMs," IEEE International Electron Devices Meeting, IEDM (2000).

Kim et al., Atomic-layer-deposited WNxCy thin films as diffusion barrier for copper metallization, Applied Physics Letters, Jun. 23, 2003, vol. 82, Issue 25, pp. 4486-4488.

Kirk-Othmer, Encyclopedia of Chemical Technology, John Wiley & Sons, Inc., 1992, vol. 4, pp. 841-878.

Klaus et al., Atomic layer deposition of tungsten and tungsten nitride using sequential surface reactions, AVS 46th International Symposium, 1999, Seattle, WA, US.

Klaus et al., Atomic Layer Deposition of Tungsten Nitride Films Using Sequential Surface Reactions, Journal of the Electrochemical Society, 2000, vol. 147, Issue 3, pp. 1175-1181.

Klaus et al., Atomic layer deposition of tungsten using sequential surface chemistry with a sacrificial stripping reaction, Thin Solid Films, 2000, vol. 360, pp. 145-153.

Klaus et al., Atomically controlled growth of tungsten and tungsten nitride using sequential surface reactions, Applied Surface Science, 2000, vol. 162-163, pp. 479-491.

Kukli et al., Properties of (Nb1-xTax)2O5 Solid Solutions and (Nb1-xTax)2O5-ZrO2 Nanolaminates Growth by Atomic Layer Epitaxy, , NanoStructured Materials, 1997, vol. 8, pp. 785-793.

Lai et al., Precursors for Organometallic Chemical Vapor Deposition of Tungsten Carbide Films, Chem. Mater., 1995, vol. 7, pp. 2284-2292.

Lakomaa et al., "Surface reactions in Al2O3 growth from trimethylaluminum and water by atomic layer epitaxy," Applied Surface Science, vol. 107, pp. 107-115 (1996).

Leskelä et al., ALD precursor chemistry: Evolution and future challenges, Jour. Phys. IV France 9, 1999, pp. 837-852.

Ludviksson et al., Low-Temperature Thermal CVD of Ti-Al Metal Films Using a Strong Reeducing Agent, Chem. Vap. Deposition, 1998, vol. 4, Issue 4, pp. 129-132.

Martensson et al., Atomic Layer Epitaxy of Copper and Tantalum, Chemical Vapor Deposition, 1997, vol. 3, Issue 1, pp. 45-50.

Martensson et al., CU(THD)2 As Copper Source in Atomic Layer Epitaxy, Electrochemical Society Proceedings, vol. 97-25, (1997) pp. 1529-1536.

Martensson, Use of atomic layer epitaxy for fabrication of Si/TiN/Cu structures, J. Vac. Sci. Technol. B, Sep./Oct. 1999, vol. 17, Issue 5, pp. 2122-2128.

Matsunami et al., Hetero-interface control and atomic layer epitaxy of SiC, Applied Surface Science, 1997, vol. 112, pp. 171-175.

Min et al., Atomic Layer Deposition of TiN Films by Alternate Supply of Tetrakis (ethylmethylamino)—Titanium and Ammonia, Jpn. J. Appl. Phys., 1998, vol. 37, pp. 4999-5004.

Min et al., Atomic Layer Deposition of TiN Thin Films by Sequential Introduction of Ti Precursor and HN3, Mat. Res. Soc. Symp. Proc., 1998, vol. 514, pp. 337-342.

Nakajima et al., Chemical Vapor Deposition of Tungsten Carbide, Molybdenum Carbide Nitride, and Molybdenum Nitride Films, J. Electrochem. Soc., Jun. 1997, vol. 144, Issue 6, pp. 2096-2100.

Polyakov et al., Growth of GaBN Ternary Solutions by Organometallic Vapor Phase Epitaxy, Journal of Electronic Materials, 1997, vol. 26, Issue 3, pp. 237-242.

Ritala et al., "Controlled Growth of TaN, Ta3N5, and TaOxNy Thin Films by Atomic Layer Deposition", Chem. Mater., 1999, vol. 11, pp. 1712-1718.

Ritala et al., Atomic Layer Epitaxy Growth of TiN Thin Films for TiI4 and NH3, J. Electrochem. Soc., Aug. 1998, vol. 145, Issue 8, pp. 2914-2920.

Ritala et al., Atomic layer epitaxy growth of TiN thin films, J. Electrochem. Soc., 1995, vol. 142, Issue 8, pp. 2731-2737.

Ritala et al., Effects of intermediate zinc pulses on properties of TiN and NbN films deposited by atomic layer epitaxy, Appl. Surf. Sci., 1997, vol. 120, pp. 199-212.

Ritala et al., Perfectly conformal TiN and Al2O3 films deposited by atomic layer deposition, Chem. Vapor Deposition, 1999, vol. 5, pp. 7-9.

Ritala et al., Surface roughness reduction in atomic layer epitaxy grown of titanium dioxide thin films, Thin Solid Films, vol. 249, pp. 155-162 (1994).

(56) References Cited

OTHER PUBLICATIONS

Sadayuki et al., Sub-atomic layer growth of SiC at low temperatures, Japanese Journal of Applied Physics, 1995, vol. 34, Issue 11, pp. 6166-6170.

Sherman et al., Plasma enhanced atomic layer deposition of Ta for diffusion barrier applications, AVS 46th International Symposium, Oct. 26, 1999, Seattle, WA, US.

Song et al., "Formation of Tantalum Carbide and Nitride Phases in Atomic Layer Deposition Using Hydrogen Plasm and tert-Butylimido-tris(diethylamido)-tantalum (TBTDET), and its Effect on Material Properties", Chemical Vapor Deposition, 2008, vol. 14, pp. 334-338.

Suntola, "Atomic Layer Epitaxy," Handbook of Crystal Growth 3, Ch. 14, pp. 601-663 (1994).

Triyoso, D.H. et al., "Characteristics of Mixed Oxides and Nanolaminates of Atomic Layer Deposited Hf02-Ti02 Gate Dielectrics," Journal of The Electrochemical Society, 153 (9), pp. 834-839, 2006.

Tulhoff et al., Ullmann's Encyclopedia of Industrial Chemistry, 5th, Completely Revised Edition, 1986, vol. A5, pp. 61-77.

U.S. Appl. No. 10/049,125, filed Aug. 20, 2002 including prosecution history, including but not limited to, Office Action dated Apr. 8, 2004, Office Action dated Jun. 18, 2003, and Office Action dated Oct. 27, 2003.

U.S. Appl. No. 10/242,368, filed Sep. 12, 2002 including prosecution history, including but not limited to, Office Action dated Oct. 20, 2004, Office Action dated Apr. 27, 2004, and Notice of Allowance dated Jul. 19, 2005.

U.S. Appl. No. 10/969,297, filed Oct. 19, 2004 including prosecution history, including but not limited to, Office Action dated Oct. 11, 2006, Office Action dated Apr. 12, 2007, and Notice of Allowance dated Sep. 18, 2007.

U.S. Appl. No. 11/286,203, filed Nov. 22, 2005 including prosecution history, including but not limited to, Office Action dated Sep. 28, 2007.

U.S. Appl. No. 11/288,872, filed Nov. 28, 2005 including prosecution history, including but not limited to, Office Action dated Jul. 2, 2007, Office Action dated Jan. 30, 2008, Office Action dated Sep. 9, 2008, Office Action dated Dec. 4, 2008, and Office action dated Aug. 20, 2009.

U.S. Appl. No. 11/591,845, filed Nov. 1, 2006 including prosecution history, including but not limited to, Office Action dated Sep. 4, 2008, Office Action dated May 28, 2009, and Notice of Allowance dated Sep. 4, 2009.

Utriainen et al., "Controlled Electrical Conductivity in SnO2 Thin Films by Oxygen or Hydrocarbon Assisted Atomic Layer Epitaxy," J. Electrochem. Soc. 146(1):189-193 (1999).

Wong et al., Barriers for copper interconnections, Solid State Technology, 1999, pp. 1-7.

Yang et al., Atomic Layer Deposition of Tungsten Film from WF6/B2H6: Nucleation Layer for Advanced Semiconductor Devices, Advanced Metallization Conference 2001 (AMC 2001), Conference Proceedings ULSI XVII@2002 Materials Research Society, 2001, pp. 655-660.

Zhang et al., "High permittivity thin film nanolaminates," Journal of Applied Physics, vol. 87, No. 4, pp. 1921-1924 (2000).

\* cited by examiner

ATOMIC LAYER DEPOSITION OF ALUMINUM FLUORIDE THIN FILMS

CROSS-REFERENCE TO RELATED APPLICATIONS

This application claims the benefit of U.S. Provisional Patent Application No. 61/939,479, filed Feb. 13, 2014, the disclosure of which is incorporated herein by reference in its entirety.

PARTIES OF JOINT RESEARCH AGREEMENT

The invention claimed herein was made by, or on behalf of, and/or in connection with a joint research agreement between the University of Helsinki and ASM Microchemistry Oy signed on Nov. 21, 2008. The agreement was in effect on and before the date the claimed invention was made, and the claimed invention was made as a result of activities undertaken within the scope of the agreement.

BACKGROUND OF THE INVENTION

1. Field of the Invention

The present application relates to deposition of thin films using two different metal halide reactants. For example, aluminum fluoride thin films can be deposited by atomic layer deposition using an aluminum halide reactant and a second metal reactant, such as a titanium halide.

2. Background

Aluminum fluoride, as many other metal fluorides, is a material with a high band gap and low refractive index. Due to these properties, aluminum fluoride is an interesting optical material and has been studied in the optics community as a polarizing mirror material for vacuum ultraviolet radiation and as an antireflection coating material. $AlF_3$ is also of interest to the semiconductor industry as it is a suitable resist material for electron beam lithography, and could be used as a p-type capping layer on top of high-k dielectric in MOS structures, such as in PMOS.

In addition, much interest in $AlF_3$ has been shown in the lithium ion battery community, with $AlF_3$ being used as an artificial SEI-layer to improve cathode rate capability and capacity retention in lithium ion batteries. Some thirty years ago, $AlF_3$ was also demonstrated to show ionic conductivities of the order of $10^{-6}$ S/cm, when combined with lithium fluoride. This means that the combination of $AlF_3$ and LiF could perhaps be used as a solid lithium ion electrolyte material.

Aluminum fluoride films are traditionally deposited by a variety of physical techniques, the most often used being thermal evaporation. In addition, sputtering methods have been studied. Many of the potential uses of aluminum fluoride, such as the optical and battery related applications, require thin and conformal films. This makes atomic layer deposition an attractive method for $AlF_3$ depositions. Some fluorides can be deposited by ALD using HF as the fluorine source. For example, $AlF_3$ has been deposited by ALD using trimethylaluminium (TMA) and an HF-pyridine mixture as precursors. However, HF is highly corrosive and, as such, dangerous to both the ALD equipment and its operator. Research has been carried out on safer fluorine precursors, such as $TiF_4$ and $TaF_5$. All these processes utilize thd-complexes as the metal precursor. A downside of using these metal containing fluorine precursors is that they can lead to large amounts of metal impurities at low deposition temperatures.

SUMMARY OF THE INVENTION

According to one aspect, atomic layer deposition methods are provided for depositing aluminum fluoride films on a substrate. In some embodiments the methods comprise at least one deposition cycle in which a substrate in a reaction space is alternately and sequentially contacted with a first metal halide precursor comprising Al and a second metal halide precursor comprising fluorine. In some embodiments the first metal precursor is $AlCl_3$. The second metal precursor typically comprises a different metal from aluminum. In some embodiments the second metal halide precursor may comprise titanium. For example, the second metal halide precursor may comprise $TiF_4$. Other possible second metal halide precursors include $NbF_5$, $TaF_5$, $WF_6$, $MoF_x$ and $VF_x$.

In some embodiments the deposition temperature may be from about 150° C. to about 450° C. The aluminum fluoride film may have a work function greater than about 5.0 eV. In some embodiments the aluminum fluoride film is deposited to a thickness of less than about 1.0 nm. The aluminum fluoride film may be used in any of a variety of contexts. For example, it may be deposited over a high-k layer, and may serve as a p-type capping layer in some embodiments.

In another aspect, methods are provided for depositing a thin film on a substrate using two metal halide reactants. In some embodiments a substrate in a reaction space is contacted with a first metal halide reactant such that the first metal halide reactant adsorbs on the substrate surface. The substrate is contacted with a second metal halide reactant that is different from the first metal halide reactant, such that the second metal halide reactant reacts with the adsorbed first metal halide reactant on the substrate surface. In some embodiments the first and second metal halides do not contain any ligands other than halides. In some embodiments the first reactant comprises only chloride ligands and the second reactant comprises only fluoride ligands. The thin film may comprise less than about 10 at-% non-metallic impurities in some embodiments.

In some embodiments the thin film may be, for example, a metal fluoride film, such as an aluminum fluoride film. In some embodiments the growth rate of an aluminum fluoride film may be from about 0.1 Å/cycle to about 5 Å/cycle. The first metal halide may comprise aluminum and the second metal halide may comprise a different metal, such as titanium. In some embodiments the first reactant is $AlCl_3$ and the second reactant is $TiF_4$.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION

Figure 1:
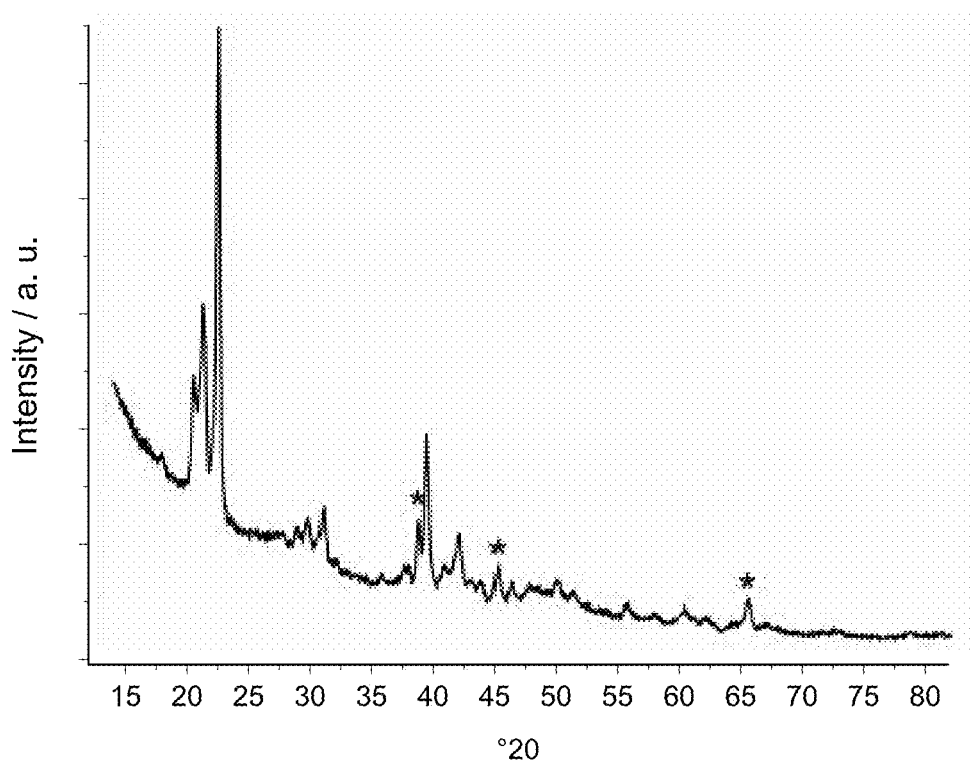
FIG. 1 is an X-ray diffractogram of a LiF film exposed to $Al(thd)_3$ and $TiF_4$. Peaks marked with an asterisk belong to LiF.

In view of the difficulties that had been experienced in depositing aluminum fluoride films by known ALD processes, other means for depositing aluminum fluoride films were studied. Applicants found, among other things, that an ALD reaction utilizing two metal halide precursors can produce acceptable aluminum fluoride films. In particular, in some embodiments a halide-halide exchange reaction is used for the atomic layer deposition of AlF$_3$ using two halide precursors. For example, AlCl$_3$ and TiF$_4$ may be used in some embodiments as the ALD precursors.

For the sake of simplicity, AlF$_3$ is used herein to illustrate a material containing Al—F bonds with various stoichiometries, such as AlF$_x$, wherein x is preferably from about 2 to about 5, more preferably from about 2.5 to about 3.5. In some embodiments, films comprising metal fluoride deposited by the methods described herein may have various stoichiometries. For example, the fluorine content in the metal fluoride films may range from about 20 at-% to about 80 at-%. In some embodiments the fluorine content may range from about 35 at-% to about 75% at-%.

In some embodiments, a metal fluoride thin film deposited as described herein may haves metallic impurities of less than 10 at-%, or even less than 5 at-%. The metallic impurities may comprise one or more other metals than the metal or metals desired in the metal fluoride. For example, in some embodiments an aluminum fluoride thin film may comprise less than 10 at-% or less than 5 at-% of a metal other than aluminum.

In some embodiments, a metal fluoride thin film deposited as described herein has non-metallic impurities of less than 20 at-%, less than 10 at-%, or even less than 5 at-%. The non-metallic impurities are considered to be non-metallic constituents other than fluorine. For example, in some embodiments an aluminum fluoride film may comprise non-metallic impurities (other than fluorine) of less than 20 at-%, less than 10 at-% or less than 5 at-%.

Because of its high fluorine content, in some embodiments AlF$_3$ deposited as described herein has a high work function, for example >5.0 eV, or even >5.2 eV. Thus, in some embodiments such an aluminum fluoride film can be used for a p-type capping layer top of high-k dielectric. Further the high work function makes it possible to have ultra-thin capping layers. In some embodiments an aluminum fluoride capping layer deposited as described herein is less than 3 nm thick, less than 1.5 nm and in some cases less than 1.0 nm thick. In some embodiments a capping layer that is less than 0.5 nm could be deposited. In some embodiments the high-k layer over which a capping layer is deposited comprises hafnium or zirconium. For example, the high-k layer may comprise HfO$_2$ or ZrO$_2$.

In some embodiments a substrate comprising a high-k dielectric is provided into a reaction space and an aluminum fluoride film is deposited directly over the high-k dielectric by a one or more cycles of an ALD process as described herein. In some embodiments the high-k dielectric may comprise HfO$_2$ or ZrO$_2$. In some embodiments the aluminum fluoride thin film may comprise less than 10 at-% or less than 5 at-% of a metal other than aluminum and less than 20 at-%, less than 10 at-% or less than 5 at-% of non-metallic impurities.

For the sake of simplicity the deposited material is referred to as a "layer" or "film" herein. Unless indicated otherwise, these terms are is meant to cover instances where a full-coverage metal fluoride film is not formed on the substrate. For example, the term "layer" or "film" is intended to cover embodiments in which there are pinholes in the deposited material or there are separate or partially connected grains/crystallites of fluoride materials on the substrate. This may be the case, for example, with very thin nominal thicknesses films. Of course, in some embodiments a complete layer or film is deposited that fully covers at least a portion of the substrate.

In some embodiments a thin film is deposited by a deposition process comprising at least one deposition cycle in which a substrate in a reaction space is contacted with a first metal reactant and a second metal reactant, where the first metal reactant is a first metal halide comprising a first metal and the second metal reactant is a second metal halide comprising a second metal, where the second metal halide is different from the first metal halide. In some embodiments the first and second metal halides do not contain any ligands other than halide ligands.

The reaction space may be part of a vapor deposition reactor. For example, in some embodiments the reaction space is part of a flow-type ALD reactor.

In some embodiments a metal fluoride film is deposited by more than 1 deposition cycle in which a substrate in a reaction space is contacted with a first metal reactant and a second metal reactant, where at least one of the reactants comprises fluorine. In some embodiments metal fluoride is deposited by more than 2 deposition cycles, or more than 5 deposition cycles. In other embodiments less than 50 metal fluoride deposition cycles are performed, or even less than 20 deposition cycles.

In some embodiments the growth rate of the film is from about 0.1 Å/cycle to about 5 Å/cycle, preferably from about 0.5 Å/cycle to about 4 Å/cycle.

In some embodiments the as-deposited metal fluoride film is mainly amorphous (as detected by XRD). In some embodiments metal fluoride film is annealed after deposition, preferably in inert atmosphere or oxygen-free ambient, such as $N_2$, $N_2/H_2$ or noble gases, such as Ar or He, and film is crystallised, preferably to tetragonal form, such as $AlF_3$.

In some embodiments a thin film is deposited that comprises aluminum fluoride. For example, the first metal reactant may comprise aluminum and the second metal reactant may comprise a different metal, such as titanium.

The skilled artisan will appreciate that although they are referred to as the first metal reactant and the second metal reactant herein, the order in which the substrate is contacted with the first and second reactant may be reversed in some embodiments. For example, in some embodiments a deposition cycle may begin by contacting the substrate with the second reactant, and the first reactant can be subsequently supplied after the second reactant.

In some embodiments the substrate is a $SiO_2/Si$ substrate. In some embodiments the substrate is a LiF/Si substrate.

In some embodiments the substrate is selected so that both reactants do not etch the substrate and a good quality film is observed. In some embodiments this means that the film has full coverage of the substrate surface. In some embodiments this means that the thin film has good uniformity.

In some embodiments a thin film is deposited by an atomic layer deposition type process comprising at least one cycle in which the substrate is alternately and sequentially contacted with a first vapor phase metal halide reactant comprising a first metal and a second vapor phase metal halide reactant comprising a second metal.

In some embodiments an atomic layer deposition process comprises at least one deposition cycle comprising:
  Providing a pulse of the first vapor phase metal halide reactant to a reaction chamber comprising a substrate on which deposition is desired, such that the first reactant adsorbs on the substrate surface;
  Removing excess first reactant and reaction by products, if any, from the reaction space, such as by purging with an inert gas;
  Providing a pulse of the second vapor phase metal halide reactant to the reaction space, such that the second reactant reacts with the adsorbed first reactant to form the desired metal film; and
  Removing excess second reactant and reaction by products, if any, from the reaction space, such as with an inert gas.

In some embodiments the second metal in second metal halide reactant is different from the first metal in first metal halide reactant.

In some embodiments the first metal halide reactant comprises a first halogen that is different from a second halogen in the second metal halide reactant. In some embodiments the first metal halide reactant and second metal halide reactant comprise only halides as ligands.

In some embodiments the halide ligands of the first metal halide reactant are different from the halide ligands of the second metal halide reactant. In some embodiments the first metal halide reactant comprises at least one chloride ligand. In some embodiments the first metal halide reactant comprises only chloride ligands. In some embodiments the second metal halide reactant comprises at least one fluorine ligand. In some embodiments the second metal halide reactant comprises only fluoride ligands.

In some embodiments, in an ALD cycle the substrate is contacted with the first metal halide reactant and first metal halide reactant may adsorb on the substrate surface. Excess first metal halide reactant may then be removed in some embodiments. The substrate is then contacted with the second metal halide reactant, which reacts with the adsorbed first metal halide to form a thin film. In some embodiments no other reactants are provided in at least one ALD cycle. In some embodiments no other reactants are provided in the entire deposition process. Thus, in some embodiments there are only two reactants used in the deposition process. In some embodiments only metal halide reactants are utilized in the deposition process. However, in some embodiments other materials that do not react with the metal halide reactants and/or the growing film may be used. For example, inert gases may be used to remove excess reactants from the reaction space.

In some embodiments plasma is not used in the deposition process. In some embodiments the process does not utilize hydrogen $H_2$ or a separate hydrogen reactant which does not comprise a metal that is also used in a halide reactant. In some embodiments the deposition process does not utilize an oxygen or nitrogen reactant in at least one cycle. In some embodiments the deposition process does not utilize an oxygen or nitrogen reactant in which there is not metal present in the precursor that is also present in a halide reactant. For example, in some embodiments $H_2O$, $O_2$, $O_3$, $N_2$, $NH_3$, or excited species of those, such as radicals or plasma comprising oxygen or nitrogen are not used in the deposition process. In preferred embodiments the deposition process does not utilize a fluorine reactant in which there is not metal present in the precursor, such as HF, $NF_3$ or $F_2$ or excited species of those, such as radicals or plasma comprising fluorine.

The processes described herein can be continued to deposit a metal fluoride film of a desired thickness, depending on the particular application. In some embodiments less than about 20 Å, preferably less than about 15 Å, more preferably less than 10 Å of metal fluoride is deposited. In some such embodiments, less than a complete monolayer of metal fluoride is deposited.

As discussed above, in some embodiments an aluminum fluoride film is deposited by an atomic layer deposition-type process. Such a process may comprise one or more deposition cycles in which a substrate is alternately and sequentially contacted with a first metal halide reactant comprising aluminum and a second metal reactant. In some embodiments the second metal reactant comprises a halide, and in some embodiments the second metal reactant comprises fluorine.

In some embodiments the first reactant is an aluminum halide reactant and the second reactant is a second, different metal halide. In some embodiments the metal in the second, different metal halide, is not aluminum. In some embodiments the second metal halide is a metal fluoride. In some embodiments the first reactant comprises aluminum and at least one chloride ligand. In some embodiments the first reactant comprises only chloride ligands. In some embodiments the first reactant does not comprise carbon.

In some embodiments the second reactant comprises a transition metal and at least one fluoride ligand. In some embodiments the second reactant comprises only fluoride ligands. In some embodiments the second reactant does not comprise carbon.

In some embodiments the first reactant is $AlCl_3$ and the second reactant comprises a metal and at least one fluoride ligand, where the metal is preferably not aluminum. In some embodiments the second reactant is a volatile metal fluoride. In some embodiments the second reactant is a volatile transition metal fluoride, such as $TiF_4$, $NbF_5$, $TaF_5$, $WF_6$, $MoF_x$, or $VF_x$. In some embodiments the second reactant is $TiF_4$.

Thus, in some embodiments an ALD process for depositing aluminum fluoride comprises at least one cycle in which a substrate in a reaction space is alternately and sequentially contacted with a first aluminum halide reactant and a second metal fluoride reactant. For example, a substrate may be alternately and sequentially contacted with AlCl3 and a metal fluoride selected from $TiF_4$, $NbF_5$, $TaF_5$, $WF_6$, $MoF_x$, and $VF_x$. In some embodiments a substrate is alternately and sequentially contacted with $AlCl_3$ and $TiF_4$.

The deposition cycle can be repeated to deposit an aluminum fluoride film of a desired thickness, depending on the particular application. In some embodiments less than about 20 Å, preferably less than about 15 Å, more preferably less than 10 Å of $AlF_3$ is deposited. In some such embodiments, less than a complete monolayer of $AlF_3$ is deposited.

In some embodiments an aluminum fluoride film is deposited by more than 1 deposition cycle. In some embodiments aluminum fluoride is deposited by more than 2 deposition cycles, or more than 5 deposition cycles. In other embodiments less than 50 aluminum fluoride deposition cycles are performed, or even less than 20 aluminum fluoride deposition cycles.

In some embodiments the growth rate of the aluminum fluoride film is from about 0.1 Å/cycle to about 5 Å/cycle. In some embodiments the growth rate is from about 0.5 Å/cycle to about 4 Å/cycle.

In some embodiments the ALD process is carried out at a temperature of about 50 to about 1000° C., preferably from about 100 to about 800° C., more preferably from about 150 to about 600° C. In some specific cases, for example, when thermal budget restricts the reaction temperature, temperatures from about 150 to about 450° C. may be used.

In some embodiments an ALD process for depositing $AlF_3$ comprises alternately and sequentially contacting a substrate with $AlCl_3$ and $TiF_4$ at a temperature between about 160° C. and about 340° C.

In some embodiments the as-deposited aluminum fluoride film is mainly amorphous (as detected by XRD). In some embodiments the aluminum fluoride film is annealed after deposition, preferably in inert atmosphere or oxygen-free ambient, such as $N_2$, $N_2/H_2$ or noble gases, such as Ar or He, and the film is crystallized, for example to tetragonal form, such as $AlF_3$.

In some embodiments, when depositing $AlF_3$ from $AlCl_3$ and $TiF_4$, $AlCl_3$ reacts with a surface covered with $TiF_x$-groups, forming $AlF_3$ and volatile side products, such as $TiCl_4$ and $TiF_xCl_{4-x}$. The $TiF_x$-groups may have been formed by previously exposing the substrate to $TiF_4$, such as in a previous deposition cycle or in a pretreatment. In a second step, $TiF_4$ is introduced to the reaction chamber and it reacts with the $AlCl_x$ covered surface formed during the previous pulse. After this reaction, more $AlF_3$ forms, with the same side products as in the previous step. Therefore, $AlF_3$ is formed in both steps of the ALD-cycle, as opposed to a deposition cycle where a monolayer (or less) is formed only after one full cycle.

As mentioned above, aluminum fluoride films deposited by the methods described herein may be used in a variety of different contexts. In some embodiments such aluminum fluoride films are used in the optics industry. For example, a deposited aluminum fluoride layer may be used as an anti-reflective coating or as a polarizing mirror material for vacuum ultraviolet radiation. In some embodiments a deposited aluminum fluoride layer may be used as a resist material for electron beam lithography. In some embodiments deposited aluminum fluoride can be used in the battery field. For example, a deposited aluminum fluoride layer may be used as an artificial SEI-layer (solid electrolyte interface layer) in Li-ion batteries. The aluminum fluoride layer may improve the cathode rate capability and capacity retention. In some embodiments a mixture of $AlF_3$ and LiF can be used to produce a solid Li-ion electrolyte with a reasonable ionic conductivity. As discussed above, in some embodiments, $AlF_3$ layers can be used as a p-type capping layer/material on top of a high-k material. Other uses of conformal $AlF_3$ films are known in the art and will be apparent to the skilled artisan.

EXAMPLE 1

The ability to deposit thin $AlF_3$ films by ALD was tested. $Al(thd)_3$ and $AlCl_3$ were each used as the aluminum precursor and $TiF_4$ was used as the fluoride source.

$Al(thd)_3$ showed poor reactivity with $TiF_4$. No film growth was observed on $SiO_2$/Si or $Al_2O_3$/Si substrates. However, a film was formed on a LiF/Si substrate (FIG. 1). FIG. 1 is an X-ray diffractogram of a LiF film exposed to $Al(thd)_3$ and $TiF_4$. Peaks marked with an asterisk belong to LiF. The effect of deposition temperature, number of $Al(thd)_3+TiF_4$ cycles, pulse lengths and the LiF film thickness was studied. Impurity analysis with ERDA was conducted.

Figure 2:
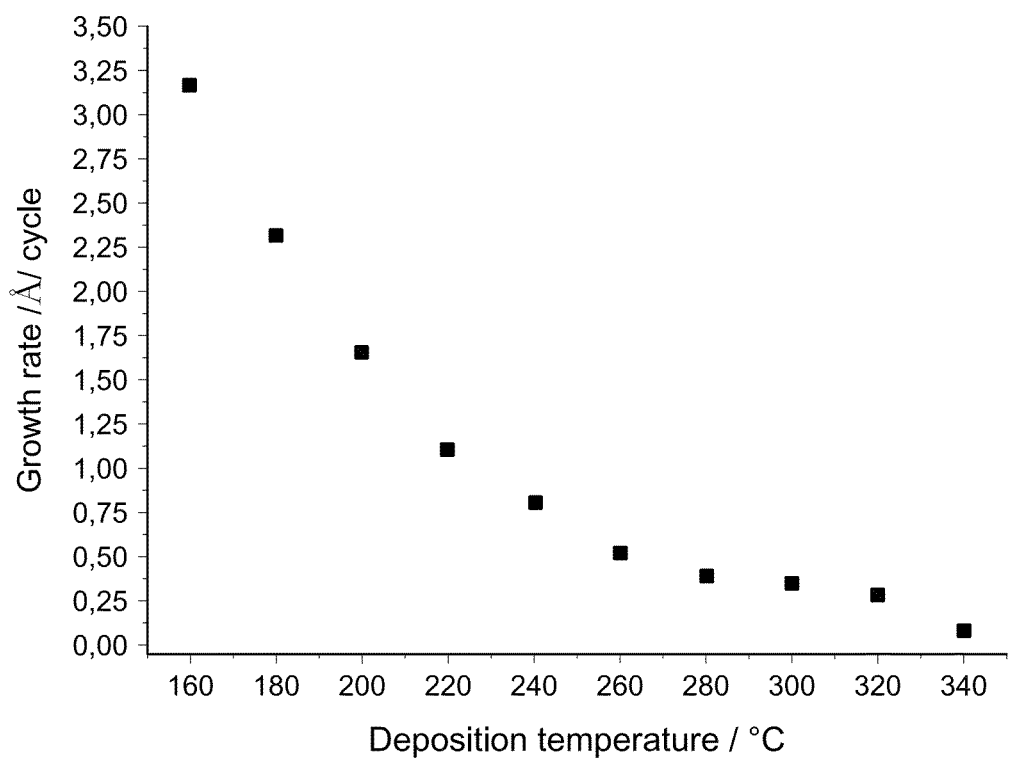
FIG. 2 is a graph of the growth rate of $AlF_3$ as a function of deposition temperature when $AlCl_3$ and $TiF_4$ were used as precursors. All films were deposited with 900 cycles using a pulsing sequence of 0.5 s pulse and 1 s purge for $AlCl_3$ and 1 s pulse and 1.5 s purge for $TiF_4$.

An aluminum halide compound was studied in place of the $Al(thd)_3$ in an ALD process with $TiF_4$. $AlCl_3$ exhibited better reactivity compared to $Al(thd)_3$ and an $AlF_3$ film was formed on a $SiO_2$/Si substrate when $TiF_4$ was used as a fluoride source. The effect of deposition temperature on film growth rate was studied and is illustrated in FIG. 2. In addition, the saturation of the precursors and the growth rate per number of cycles was studied.

EXAMPLE 2

Figure 3:
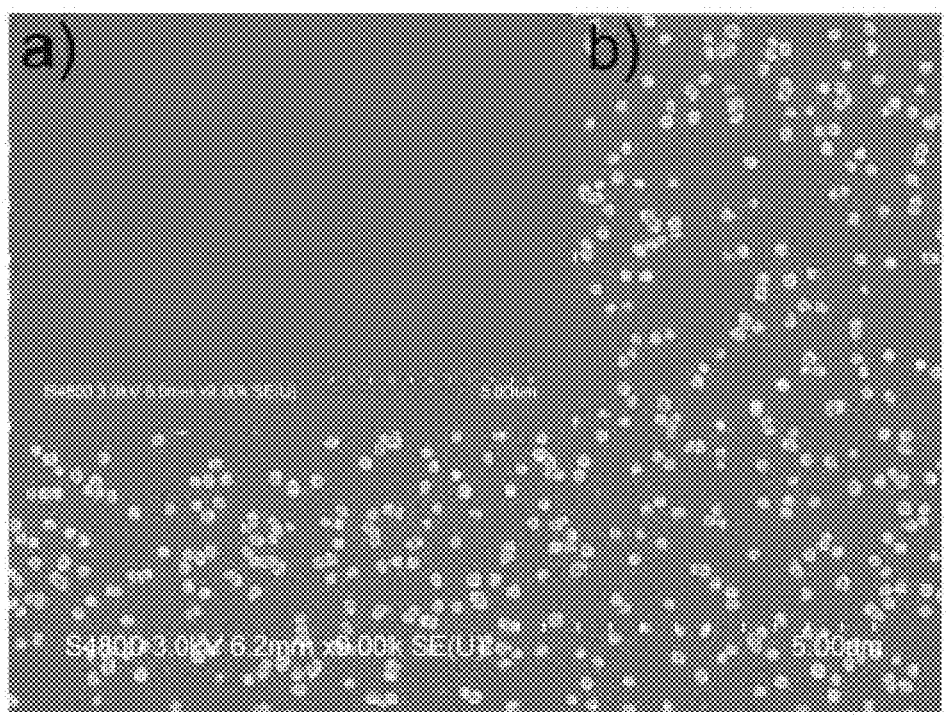
FIG. 3 is a FESEM image of $AlF_3$ deposited at a) 160° C. and b) 280° C.

$AlF_3$ films were deposited by ALD using $AlCl_3$ and $TiF_4$ as precursors at a temperature of between 160 and 340° C. No traditional ALD-window was observed in this temperature region (FIG. 2), but saturation has been confirmed at three different deposition temperatures. Refractive index values were found to lie between 1.36 and 1.40 (at 580 nm). The films were amorphous when deposited below 260° C., with hexagonal $AlF_3$ forming at higher temperatures, accompanied by the formation of globules on the film surface at 280° C. (FIG. 3). The impurity content was found to depend highly on the deposition temperature, with oxygen being the largest impurity at high temperatures, most likely because of the hygroscopicity of the material.

EXAMPLE 3

Film Deposition $AlF_3$ thin films were deposited in an ASM Microchemistry F-120™ hot-wall flow-type ALD reactor. The deposition temperature was varied between 160 and 340° C. During depositions the pressure inside the reactor was of the order of 5 mbar. Single crystalline Si(111) wafers cut into 5 cm×5 cm pieces were used as substrates. $AlCl_3$ (Alfa Aesar GmbH & Co, 99%) and $TiF_4$ (Strem Chemicals Inc., 98%) were used as precursors. The precursors were evaporated inside the reactor from open glass boats at 80° C. and 135° C., respectively. The pulsing of the precursors was done by inert gas valving. Nitrogen was used as the carrier and purging gas. Precursor pulse lengths were varied between 0.5 and 4 s. In the saturation tests, purge times were kept at 3 s. In all other experiments, the purge times were 0.5 s longer than the preceding precursor pulse time.

Film Characterization

UV-Vis spectroscopy was used to evaluate the thickness and refractive index of the films. A Hitachi U2000 spectrophotometer was used in the measurements, and the thickness and refractive index values were determined from reflection spectra by a fitting program developed by Ylilammi and Ranta-aho. The wavelength range was 370-1050 nm. For the thinnest films (up to ~60 nm), thickness was determined with X-Ray reflectivity measurements (XRR) with a PANalytical X'Pert Pro MPD X-ray diffractometer.

Crystallinity of the films was studied by grazing incidence X-ray diffraction measurements conducted with the PANalytical X'Pert Pro MPD X-ray diffractometer. The morphology of the films was studied by scanning electron microscopy with a Hitachi S4800 FESEM instrument. The composition of the films was studied both with energy dispersive X-ray spectroscopy (EDX) (Oxford INCA 350 Energy spectrometer connected to the Hitachi S-4800 FESEM instrument) and elastic recoil detection analysis (ERDA).

Film Deposition $AlF_3$ growth rate as a function of deposition temperature is presented in FIG. 2. 900 cycles of $AlF_3$ was deposited at all temperatures. At low temperatures the growth rate is very high for an ALD-process. The growth rate drops rapidly as temperature is increased, with no clear ALD-window present. Films with fewer cycles were deposited at higher temperatures (not shown in FIG. 2). Thinner films were needed due to crystallization, which hindered thickness measurements with XRR. At 320° C. the growth rate was slightly lower than at 300° C. At 340° C. the rate dropped to about 0.08 Å/cycle.

Although decreasing growth rates with increasing temperatures have been seen before in ALD, both in fluorides and other materials, the change from approximately 3 Å/cycle to 0.3 Å/cycle over the range of 140° C. is notable. Growth rates of over 1.5 Å/cycle are common for fluorides deposited with $TiF_4$. It has been postulated that the high growth rates of many fluorides could be due to the reaction mechanism.

As mentioned above, when depositing $AlF_3$ by ALD, $AlF_3$ is formed in both steps of the ALD-cycle, as opposed to the typical reaction where a monolayer (or less) is formed only after one full cycle. Without wishing to be held to any particular theory, the growth rate drop at high temperatures may originate from a decreased $TiF_x$ absorption density at higher temperatures.

Below 220° C., the film thickness was determined by UV-Vis measurements. In these measurements, both the thickness and refractive index at 580 nm can be fitted. The refractive index decreases from 1.40 at 160° C. to 1.36 at 220° C., most likely due to decreasing amounts of impurities. These values correspond to refractive indices obtained for thick $AlF_3$ samples deposited by thermal evaporation. XRR was used for thickness measurements at higher temperatures due to lower film thicknesses, and therefore no refractive index data on films deposited at these temperatures is available.

Figure 4:
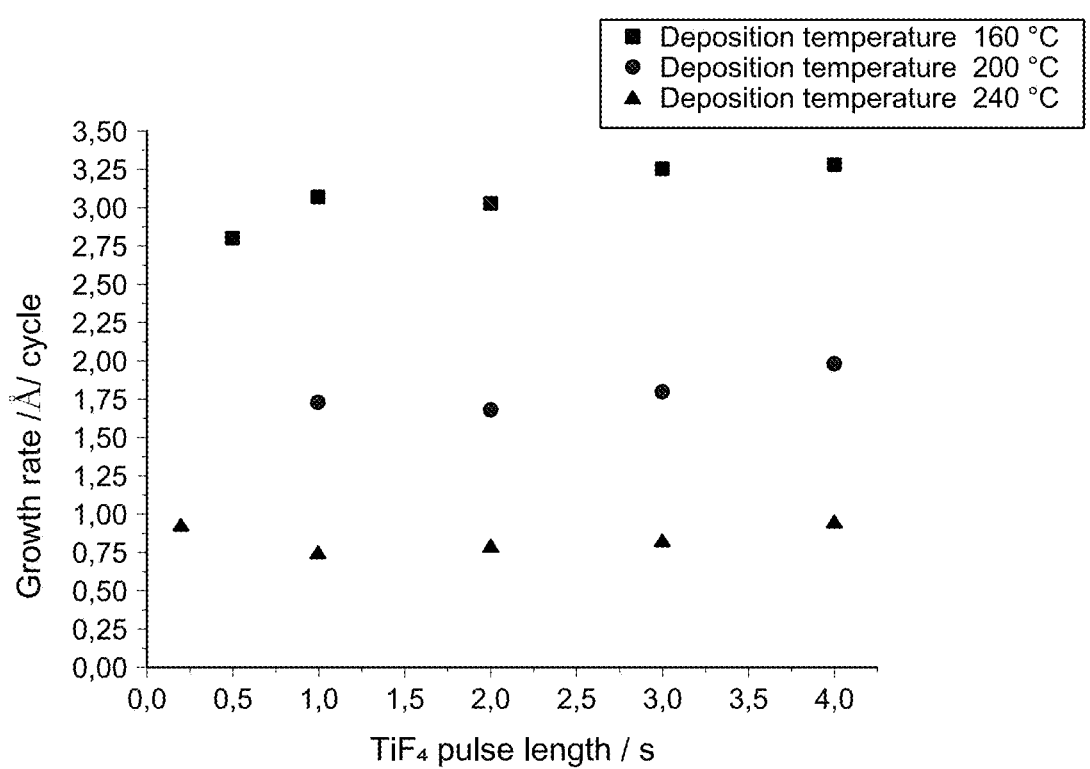
FIG. 4 is a graph illustrating the growth rate of $AlF_3$ as a function of $TiF_4$ pulse length at 160° C., 200° C., and 240° C. The $AlCl_3$ pulse length was kept at 0.5 s and purge times were 3 s.
Figure 5:
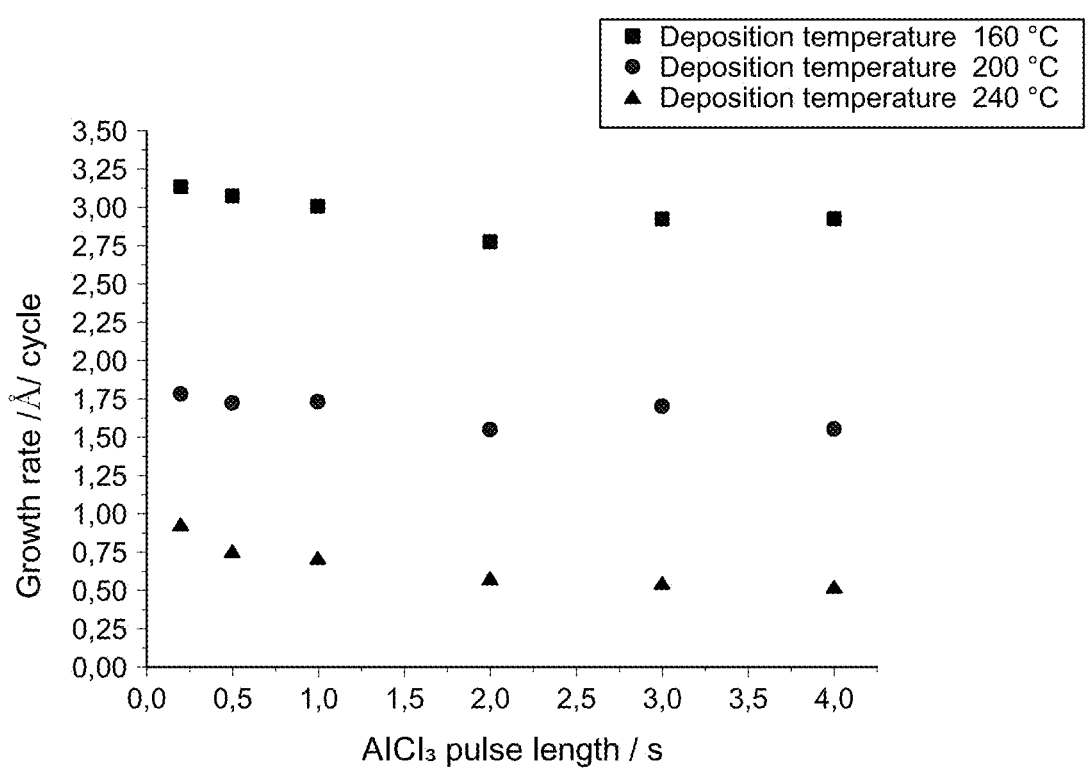
FIG. 5 is a graph illustrating the growth rate of AlF$_3$ as a function of AlCl$_3$ pulse length at 160° C., 200° C., and 240° C. The TiF$_4$ pulse length was kept at 1 s and purge times were 3 s.

In true ALD-processes saturation of precursor pulses is observed, corresponding to self-limiting growth. Self-limiting growth means that the reactive sites on the substrate determine the growth rate, and higher growth rates are not achieved by increased precursor doses. In these saturation tests purge times were kept at 3 s after both precursor pulses to ensure that no gas phase reaction were occurring. Saturation was studied at 160° C., 200° C. and 240° C. (FIGS. 4 and 5).

Film growth using $AlCl_3$ shows saturation already with a 0.5 s pulse length at 160° C. The small drop in growth rate with a 1 s and 2 s pulse length can be explained as a result of the extreme sensitivity of the growth rate to the growth temperature. As can be seen FIG. 5, the growth rate drops approximately 25% when the growth temperature is increased from 160° C. to 180° C. Consequently, it can be assumed that the small growth rate drop in FIG. 2 originates from the very small differences in the growth temperature in the different experiments.

At 200° C., saturation is again seen already with a 0.5 s $AlCl_3$ pulse length. At 200° C., the film uniformity visually decreased when the $AlCl_3$ pulse time was made longer. Going from a 0.5 s $AlCl_3$ pulse to a 4 s pulse at 200° C. increased the thickness difference between the edges of the 5 cm×5 cm substrate from 7.4% to 13.9%. The parts of the film closer to the $AlCl_3$ inlet appeared thinner than those closer to the $TiF_4$ inlet. This type of profile could result from etching reactions caused by the aluminum precursor, as the length of the $TiF_4$ pulse seemed to have no clear effect on the film uniformity. This etching effect could be clearly seen also at 240° C. As the $AlCl_3$ pulse is made longer at this temperature, the film thickness decreases. Based on these results, 0.5 s was deemed both sufficient and the upper limit for the $AlCl_3$ pulse.

The etching could also be seen when changing the number of cycles carried out: larger cycle numbers resulted in more non-uniformity. The reaction mechanism for this reaction is, for the moment, not entirely clear. However, it has been reported that the volatility of $AlF_3$ is enhanced by the presence of $AlCl_3$ vapor at temperatures between 923-983° C. The mixed-halides, $AlF_2Cl$ and $AlFCl_2$, are possible reaction products in the reported experiment. At the temperatures used in the ALD depositions, the Gibbs free energies of formation for both of these mixed halide species are more negative than that of $AlCl_3$. Therefore, mixed-halides may be formed during the ALD deposition and enhance the volatility of the $AlF_3$ film, especially on the $AlCl_3$ inlet side because of larger vapor concentration.

FIG. 4 illustrates the saturation behavior of $TiF_4$. At 160° C., a 0.5 s $TiF_4$ pulse is not long enough for proper saturation. This film was not completely uniform in the flow direction, as opposed to the film deposited with a 1 s $TiF_4$ pulse. The refractive index of the films (not shown) increased when using longer $TiF_4$ pulses, possibly indicating a larger amount of impurities. At 200° C., saturation is again seen with a 1 s pulse. The growth rate of $AlF_3$ increases when using $TiF_4$ pulse lengths longer than 2 s at this temperature. The same effect could also be seen in the saturation test made at 240° C. A similar effect was previously seen in the deposition of LiF from Lithd and $TiF_4$. In the case of LiF, it was first assumed that the increasing growth rate, also accompanied by an increasing refractive index, would be a result of an increasing amount of impurities. Yet, ERDA-measurements revealed that the amount of impurities was not elevated in these LiF films.

Figure 6:
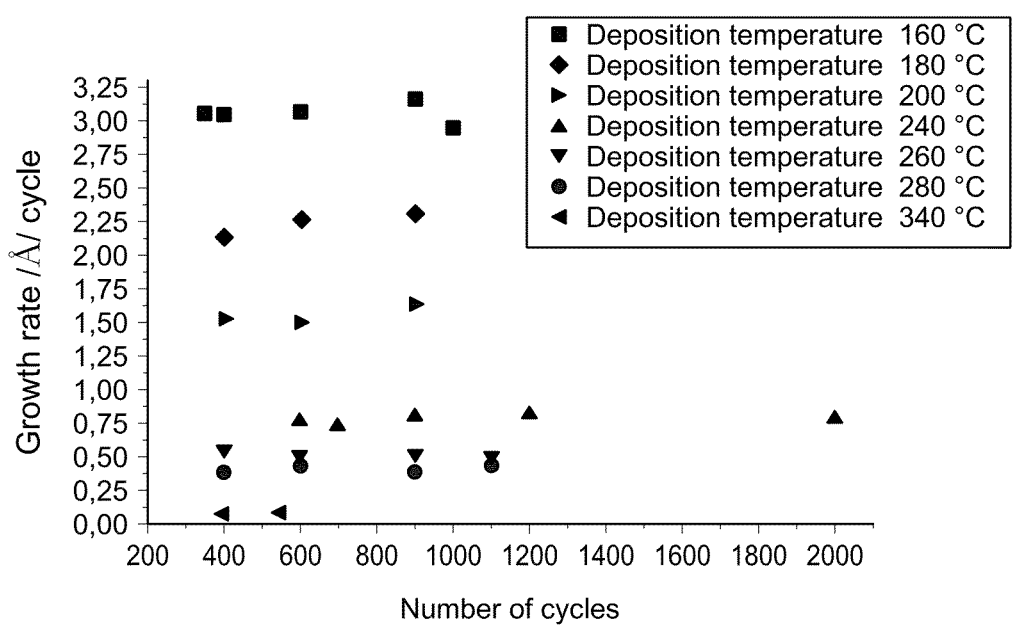
FIG. 6 is graph of the growth rates of AlF$_3$ films as a function of the number of cycles at various temperatures. All films were deposited with the following pulsing sequence: 0.5 s AlCl$_3$ pulse and 1 s purge, 1 s TiF$_4$ pulse and 1.5 s purge.
Figure 7:
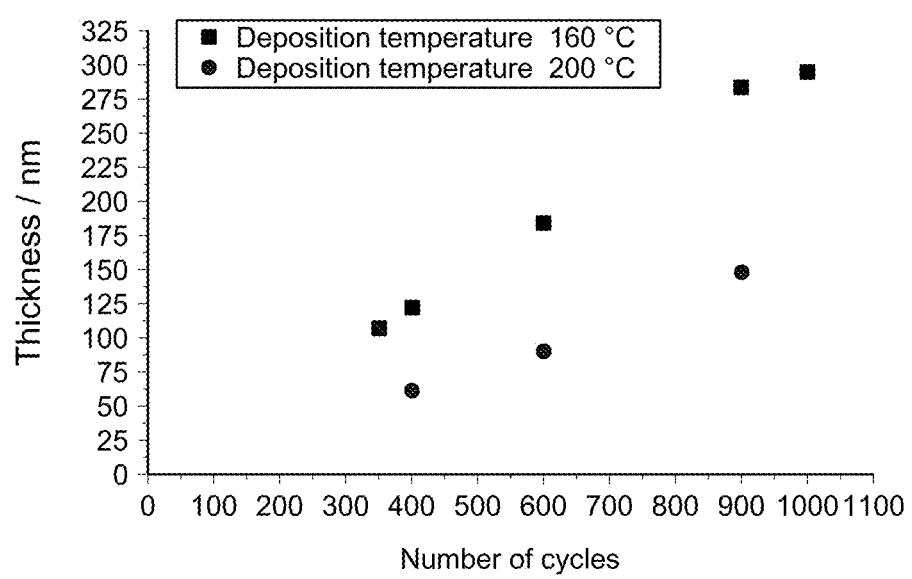
FIG. 7 is a graph of AlF$_3$ film thickness as a function of the number of deposition cycles at 160° C. and 200° C. No incubation period was present.
Figure 8:
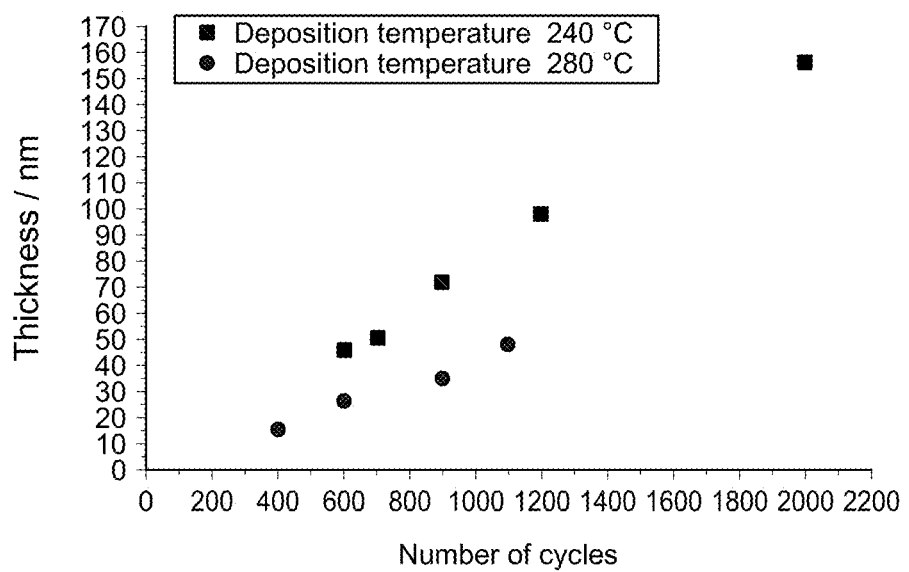
FIG. 8 is a graph of AlF$_3$ film thickness as a function of the number of deposition cycles at 240° C. and 280° C. The linearity of the growth rate is less at 280° C. than at 240° C.

As a result of the self-limiting growth behavior, growth rates in ALD-processes should not typically depend on the number of cycles. The ability to easily tune the film thickness by selecting an appropriate number of cycles has made ALD very attractive for a large number of applications, for example within the semiconductor and optics industries. Because of the lack of an ALD-window, $AlF_3$ growth rate as a function of the cycle number at a number of different temperatures has been studied. These results are collected in FIGS. 6, 7 and 8. There are slight changes in the growth rate at a given temperature. The small drop at 160° C. for a 1000 cycle film is most likely at least in part a result of the higher measurement error for such a thick film. At the high temperature end, the number of cycles used is limited by the crystallization of the film. Also, the relative differences in growth rates at different cycle numbers are larger at higher temperatures, indicating a less-than-perfect chemical reaction. Tests were also done on the repeatability of these results, and it was found that at temperatures higher than 240 C variations of the order of 10% in the growth rate do occur. As already mentioned, the non-uniformity seems to increase with the number of cycles. This might be one factor affecting the repeatability.

Film Characterization

Figure 9:
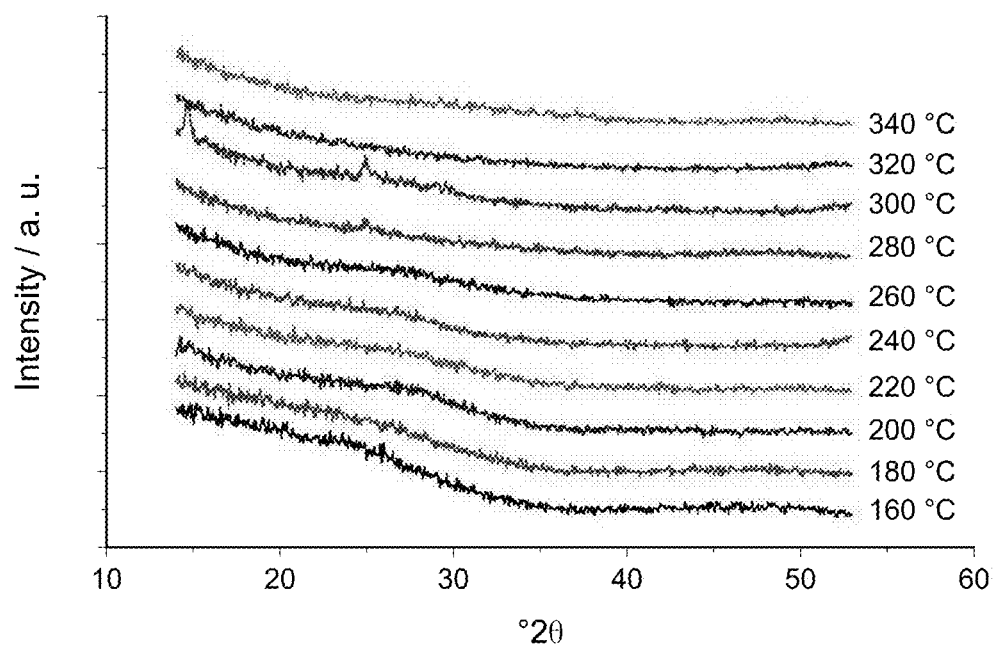
FIG. 9 shows X-ray diffractograms of AlF$_3$ films deposited at different temperatures. AlF$_3$ films were deposited at 160-280° C. with 900 cycles, while at 320° C. and 340° C. AlF$_3$ films were deposited with 400 cycles.
Figure 10:
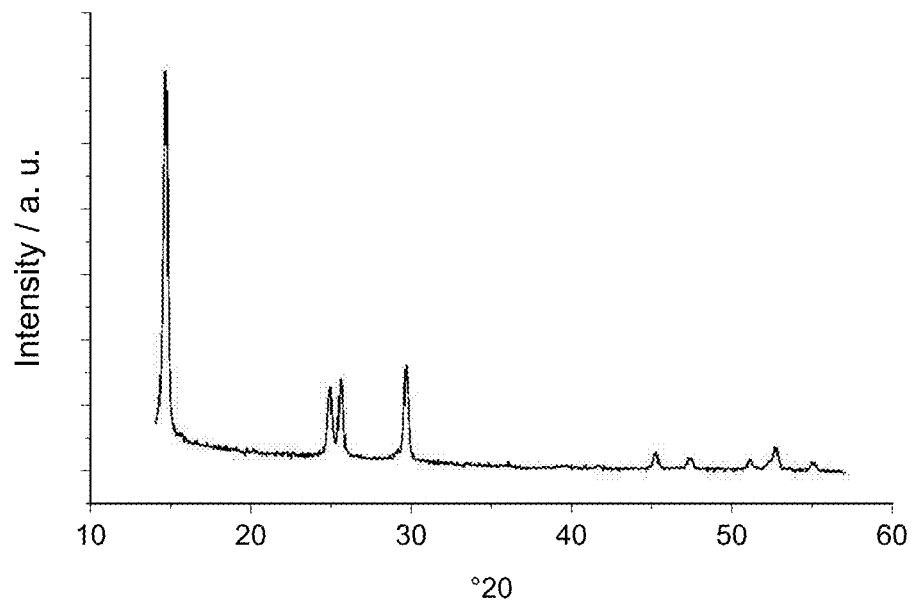
FIG. 10 shows an X-ray diffractogram of an AlF$_3$ film deposited at 340° C. using 900 cycles. The hexagonal phase can be recognized.

The crystallinity of the films was studied with GI-XRD measurements. $AlF_3$ is amorphous at the lowest deposition temperatures and shows first small signs of crystallization at 280° C. (FIG. 9). At 340° C., a film deposited with 900 cycles is opaque and shows very good crystallinity (FIG. 10). The phase in question in this film is hexagonal $AlF_3$. Film thickness measurements from this very crystalline $AlF_3$ film were not possible with the methods used.

Figure 11:
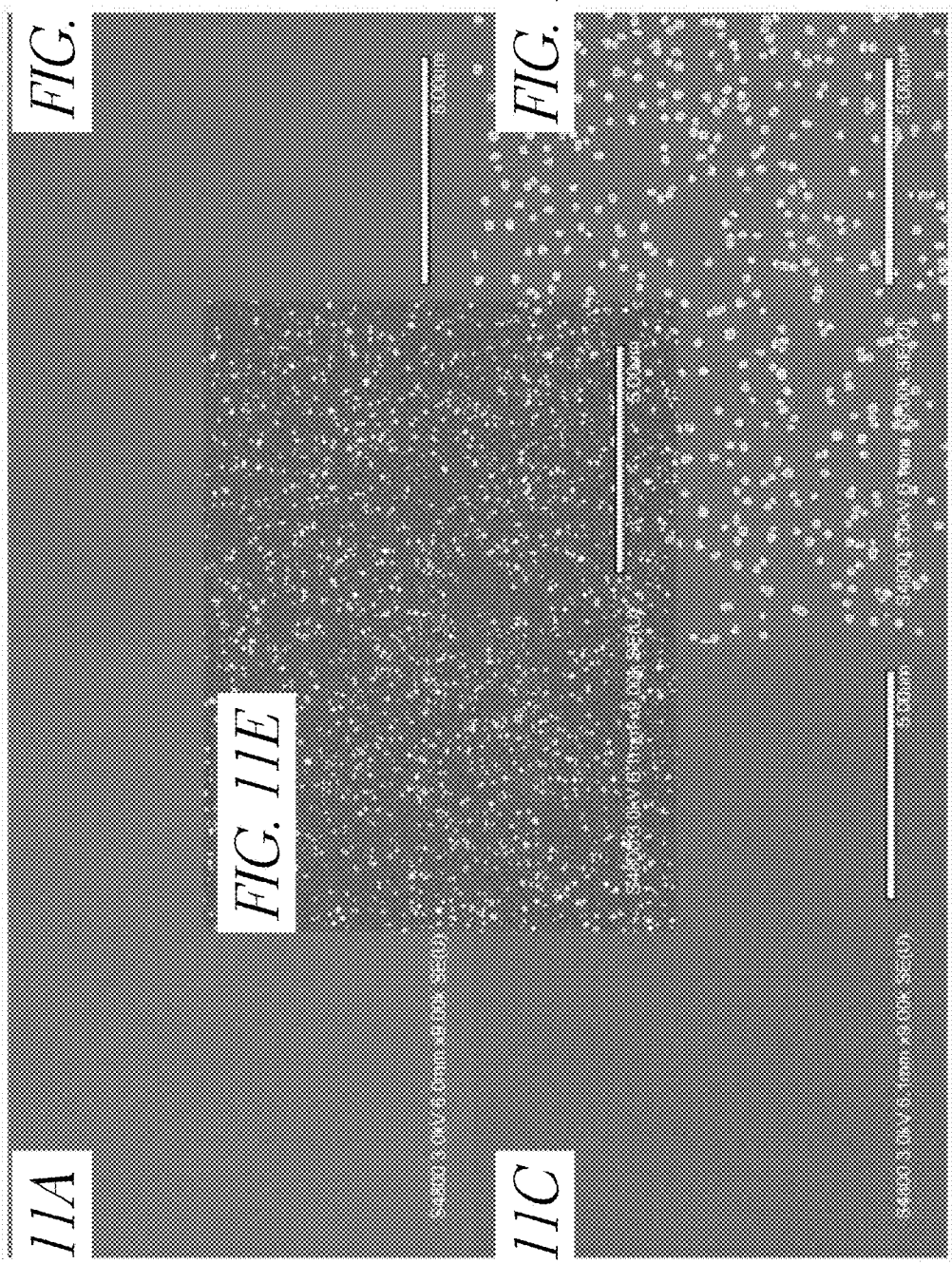
FIG. 11A-E shows FESEM images of AlF$_3$ thin films deposited at A: 160° C., B: 200° C., C: 240° C., D: 280° C. and E: 320° C. Films A-D were deposited with 900 cycles, while film E was deposited with 400 cycles.
Figure 12:
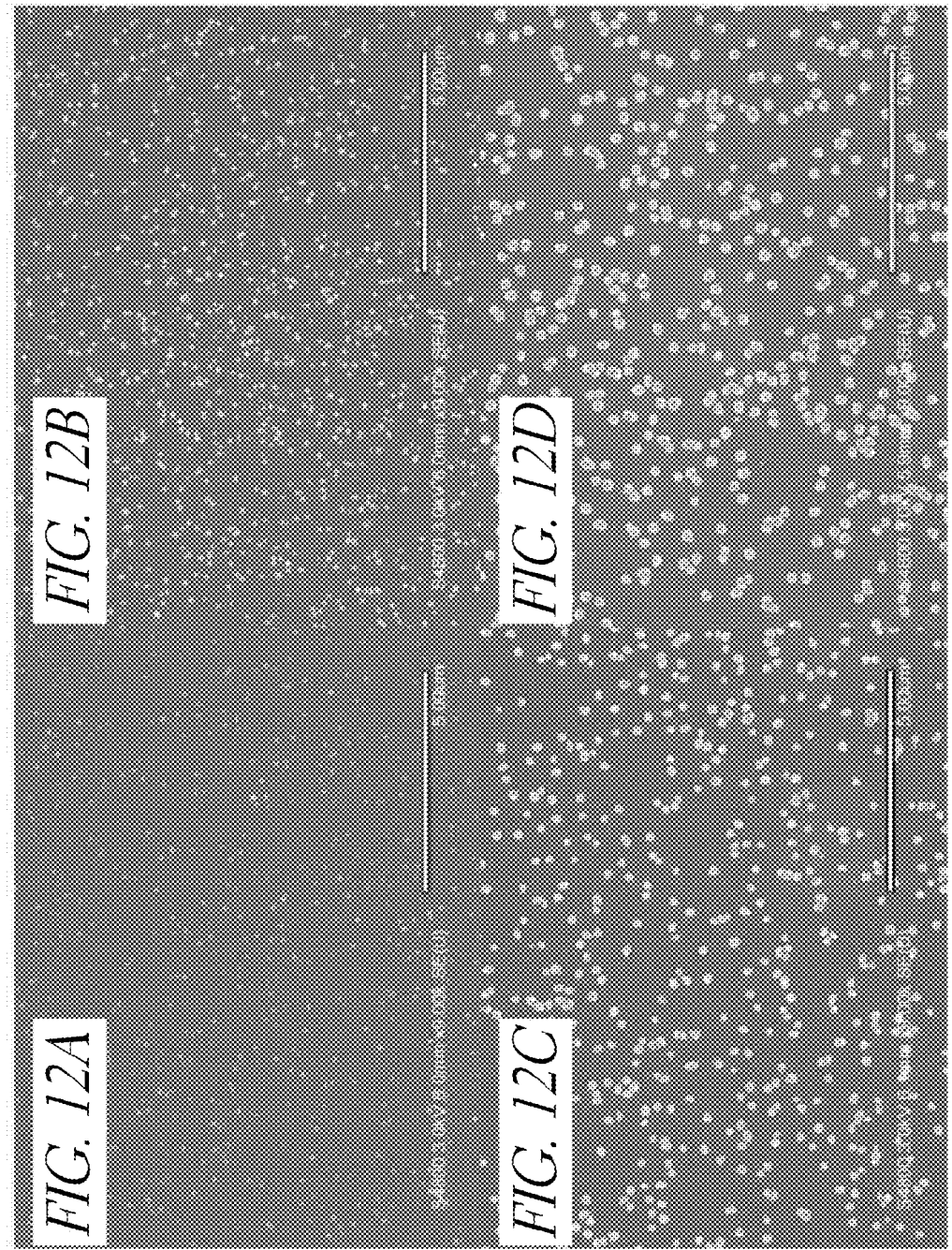
FIG. 12A-D shows FESEM images of AlF$_3$ thin films deposited at 280° C. The film thicknesses are A: 15 nm, B: 26 nm, C: 35 nm and D: 48 nm.

FESEM images corroborate the XRD results (FIGS. 11 and 12). To obtain the images, the $AlF_3$ samples were first coated with approximately 2 nm of Au/Pd by sputtering to overcome charging caused by the insulating character of $AlF_3$. As was to be expected based on the XRD results, no structural features can be seen in the films deposited at low temperatures. At 240° C., some very sparsely spaced spheres can be seen on top of the film surface at high magnification (not visible in FIG. 11). The amount of the spheres changes with deposition temperature, more spheres being present at higher temperatures. EDX measurements revealed that both the spheres and the underlying film contain Al and F. Without wishing to be held to any theory, it is postulated that the spheres form the crystalline component of the film and sit upon an amorphous layer of $AlF_3$. The amount and size of the spheres increase as films are made thicker, as can be seen in FIG. 12.

Figure 13:
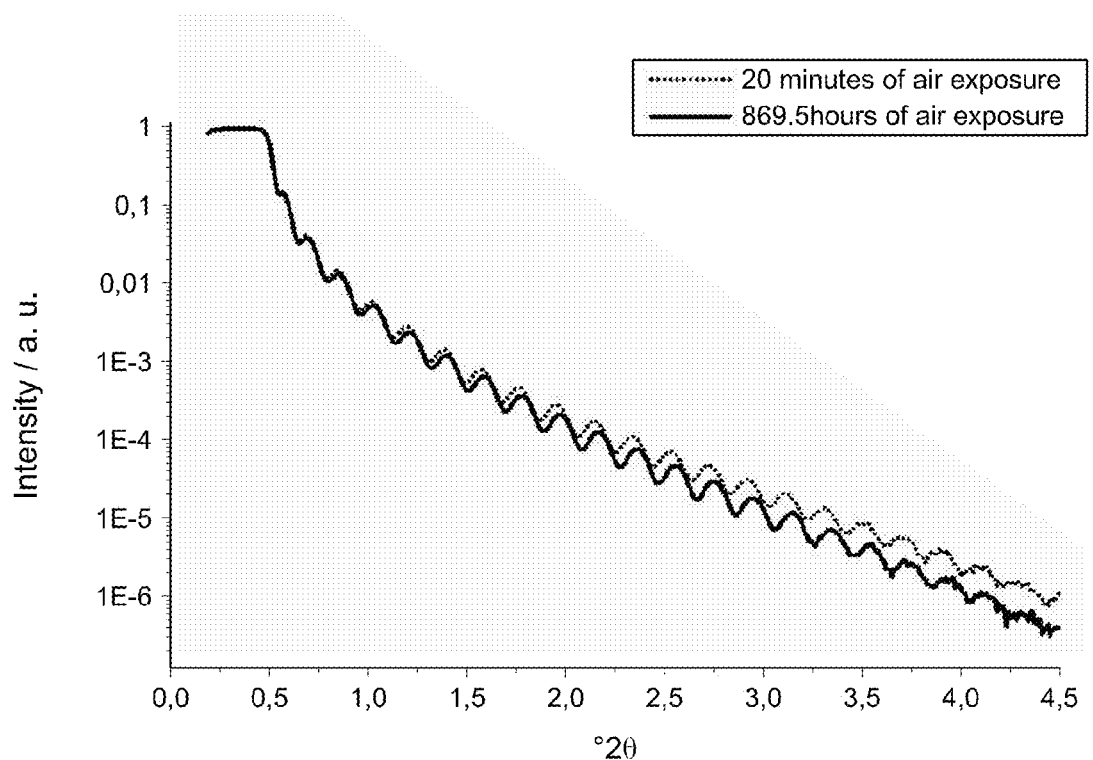
FIG. 13 is a graph of x-ray reflectance measurements on AlF$_3$ films that were exposed to air for 20 minutes and approximately 5 weeks. No multilayer structure formation is evident.

$AlF_3$ films have been reported to absorb water. As a result, $Al_2O_3$ formation has been observed in thin films of $AlF_3$. To study the possibility of $Al_2O_3$ formation on the film surface, one film deposited at 240° C. was studied with XRR for a period of 36 days, first once every hour, then once a day and finally once in two days. The first measurement was done after 20 minutes of sample removal from the ALD reactor. As can be seen in FIG. 13, there is no observable second layer formation after 5 weeks of film exposure to air. The film in question is 44 nm thick. If there was a 1-3 nm layer of $Al_2O_3$ forming on top of $AlF_3$ due to ambient air, there should be a clearly defined minimum in the graph at 2θ≈3-3.5° or 2-2.5°. However, no second layer formation is observed in this timeframe. Thus, if there is oxygen present in the $AlF_3$ film it is most likely evenly distributed and not concentrated on the surface as an $Al_2O_3$ layer.

Film composition was studied in more detail with ERDA measurements (Table 1). At all the temperatures studied, the F/Al ratio is over 3, meaning there is excess fluoride in the films. The very large Ti and Cl impurities found at 160° C. get considerably smaller already at 200° C. Still, the Ti impurity contents is high at all temperatures compared to other fluorides deposited with $TiF_4$ as the fluoride precursor. The chloride impurity originating from the aluminium precursor decreases more rapidly than the Ti impurity as the growth temperature is increased. The most striking aspect of the impurity contents is the increasing amount of O and H, as a function of temperature. This might be a result of the hygroscopic nature of $AlF_3$.

TABLE 1

ERDA results on $AlF_3$ thin films deposited at various temperatures. Film thicknesses are: 184 nm for 160° C., 150 nm for 200 C., 86 nm for 240 C. and 48 nm for 280° C.

|      | 160° C. | 200° C. | 240° C. | 280° C. |
|------|---------|---------|---------|---------|
| F    | 71.75   | 72.43   | 69.84   | 69.75   |
| Al   | 15.66   | 20.95   | 21.80   | 20.47   |
| Ti   | 4.53    | 1.90    | 1.85    | 0.92    |
| Cl   | 5.21    | 1.98    | 1.10    | 0.51    |
| O    | 1.57    | 1.79    | 2.96    | 4.17    |

TABLE 1-continued

ERDA results on $AlF_3$ thin films deposited at various temperatures. Film thicknesses are: 184 nm for 160° C., 150 nm for 200 C., 86 nm for 240 C. and 48 nm for 280° C.

|      | 160° C. | 200° C. | 240° C. | 280° C. |
|------|---------|---------|---------|---------|
| C    | 0.10    | 0.13    | 0.26    | 0.35    |
| H    | 1.18    | 0.84    | 2.20    | 3.82    |
| F/Al | 4.58    | 3.46    | 3.20    | 3.41    |

Measuring $AlF_3$ films with ERDA is made difficult because the film is rapidly being destroyed during the measurement. Fluorine loss is faster than aluminium loss, leading to slightly different elemental ratios depending on which part of the measurement is used for the calculation of atomic percents. In addition, separating aluminium from the substrate silicon signal is difficult. To separate the silicon substrate from the $AlF_3$ and to make the calculation easier, two 100 nm samples and one 200 nm sample of $AlF_3$ were deposited onto approximately 60 nm $Ta_2O_5$ films and measured with ERDA (Table 2). These samples showed F/Al ratios slightly closer to 3 than the previous samples, which indicates that improved results can be obtained from thicker $AlF_3$ samples and using a barrier between the film and the silicon substrate.

TABLE 2

ERDA results for $AlF_3$ films deposited onto a $Ta_2O_5$ layer.

|      | 110 nm $AlF_3$ film, $T_{Dep}$ = 200° C. | 210 nm $AlF_3$ film, $T_{Dep}$ = 200° C. | 102 nm $AlF_3$ film, $T_{Dep}$ = 240° C. |
|------|---------|---------|---------|
| Al   | 12.49 ± 0.6  | 17.18 ± 0.5  | 12.67 ± 0.6  |
| F    | 40.85 ± 1.2  | 51.45 ± 0.9  | 44.37 ± 1.3  |
| Ti   | 1.23 ± 0.2   | 1.57 ± 0.13  | 0.63 ± 0.2   |
| Cl   | 0.95 ± 0.2   | 1.29 ± 0.12  | 0.57 ± 0.10  |
| O    | 28.49 ± 0.8  | 18.47 ± 0.5  | 29.20 ± 0.8  |
| C    | 0.87 ± 0.12  | 0.64 ± 0.10  | 1.08 ± 0.15  |
| H    | 4.93 ± 1.1   | 2.70 ± 0.6   | 4.22 ± 1.0   |
| Ta   | 10.19 ± 0.3  | 6.71 ± 0.2   | 10.89 ± 0.3  |
| F/Al | 3.27    | 2.99    | 3.50    |
| O/Ta | 2.80    | 2.75    | 2.68    |

The use of these two halides allows for an easy and cost-efficient way of depositing $AlF_3$ by ALD. The deposited films are completely amorphous below 260° C. and show increasing amounts of crystallinity at higher temperatures. At a deposition temperature of 220 C the films show a refractive index of approximately 1.36 (at 580 nm). The growth rate of $AlF_3$ is strongly temperature dependent and no traditional ALD window is present. Nevertheless, saturation has been demonstrated at three different temperatures. The $AlCl_3$ used as the aluminum source does seem to react with the forming $AlF_3$, resulting in a small thickness gradient on the substrate. This could be one explaining factor in the small differences in the growth rate as a function of cycles. The films show some chloride and titanium impurities originating from the two precursors. The amounts of these impurities decrease with the deposition temperature, both being under 1 at % at 280° C. The $AlF_3$ films also show hydrogen and oxygen impurities, most likely originating from reactions with ambient air.

We claim:

1. An atomic layer deposition (ALD) method for forming an aluminum fluoride film on a substrate, the method comprising at least one deposition cycle comprising alternately and sequentially contacting the substrate with a first metal halide precursor comprising Al and a second metal halide precursor comprising fluorine.

2. The method of claim 1, wherein the first metal precursor is $AlCl_3$.

3. The method of claim 1, wherein the second metal precursor comprises titanium.

4. The method of claim 3, wherein the second metal precursor is $TiF_4$.

5. The method of claim 1, wherein the second metal precursor is selected from $NbF_5$, $TaF_5$, $WF_6$, $MoF_x$ and $VF_x$.

6. The method of claim 1, wherein the deposition temperature is from about 150° C. to about 450° C.

7. The method of claim 1, wherein the aluminum fluoride film has a work function greater than 5.0 eV.

8. The method of claim 1, wherein the aluminum fluoride film is deposited to a thickness of less than 1.0 nm.

9. The method of claim 1, wherein the aluminum fluoride thin film is deposited over a high-k layer.

10. A method for depositing a thin film on a substrate comprising:
    contacting the substrate with a first metal halide reactant such that first metal halide reactant adsorbs on the substrate surface; and
    contacting the substrate with a second metal halide reactant that is different from the first metal halide reactant such that the second metal halide reacts with the first metal halide on the substrate surface,
    wherein the first and second metal halides do not contain any ligands other than halides.

11. The method of claim 10, wherein the thin film is a metal fluoride thin film.

12. The method of claim 11, wherein the thin film is an aluminum fluoride thin film.

13. The method of claim 12, wherein the growth rate of the aluminum fluoride thin film is from about 0.1 Å/cycle to about 5 Å/cycle.

14. The method of claim 12, wherein the first metal halide comprises aluminum and the second metal halide comprises a different metal.

15. The method of claim 14, wherein the second metal halide comprises titanium.

16. The method of claim 15, wherein the first metal halide is $AlCl_3$ and the second metal halide is $TiF_4$.

17. The method of claim 14, wherein the second metal halide is selected from $TiF_4$, $NbF_5$, $TaF_5$, $WF_6$, $MoF_x$ and $VF_x$.

18. The method of claim 10, wherein the substrate is alternately and sequentially contacted with the first metal halide and the second metal halide.

19. The method of claim 10, wherein the thin film comprises less than 10 at-% non-metallic impurities.

20. The method of claim 10, wherein the first reactant comprises only chloride ligands and the second reactant comprises only fluoride ligands.

* * * * *